United States Patent
Tsao et al.

(10) Patent No.: US 7,564,378 B2
(45) Date of Patent: Jul. 21, 2009

(54) DATA ENCODING/DECODING METHOD AND RELATED DEVICE CAPABLE OF LOWERING SIGNAL POWER SPECTRAL DENSITY

(75) Inventors: Wen-Yuan Tsao, Hsinchu County (TW); Che-Li Lin, Taipei City (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 12/122,737

(22) Filed: May 19, 2008

(65) Prior Publication Data
US 2009/0085779 A1    Apr. 2, 2009

(30) Foreign Application Priority Data
Sep. 29, 2007    (TW) ............................... 96136541 A

(51) Int. Cl.
*H03M 7/34* (2006.01)
*H03M 7/38* (2006.01)

(52) U.S. Cl. ............................. 341/51; 341/50; 341/58; 341/95

(58) Field of Classification Search .............. 341/50–51
See application file for complete search history.

(56) References Cited

U.S. PATENT DOCUMENTS

| 6,628,256 | B2 | 9/2003 | Nishimura |
| 7,486,207 | B2 * | 2/2009 | D'Antonio et al. ............ 341/51 |

* cited by examiner

*Primary Examiner*—Khai M Nguyen
(74) *Attorney, Agent, or Firm*—Winston Hsu

(57) ABSTRACT

A data encoding and decoding method capable of lowering signal power spectral density for a binary data transmission system is disclosed. The data encoding method includes receiving binary data, performing adaptive mode tracking encoding for the binary data to generate a first encoding result, performing bit stuffing encoding for the first encoding result to generate a second encoding result, performing bit stationary state resuming encoding for the second encoding result to generate a third encoding result, and outputting the third encoding result.

21 Claims, 22 Drawing Sheets

| N=16; mode1_th=4; mode2_th=2 |||||||||||||||||
|---|---|---|---|---|---|---|---|---|---|---|---|---|---|---|---|---|
| i | 1 | 2 | 3 | 4 | 5 | 6 | 7 | 8 | 9 | 10 | 11 | 12 | 13 | 14 | 15 | 16 |
| c[i] | 0 | 1 | 0 | 1 | 0 | 1 | 0 | 1 | 0 | 0 | 0 | 0 | 0 | 0 | 0 | 0 |
| e[i] | 0 | 1 | 0 | 1 | 0 | 0 | 0 | 0 | 0 | 1 | 0 | 0 | 0 | 0 | 0 | 0 |
| mode | 1 | 1 | 1 | 1 | 1 | 2 | 2 | 2 | 2 | 2 | 2 | 1 | 1 | 1 | 1 | 1 |

| Mode | c[i-1] | c[i] | e[i-1] | e[i] |
|---|---|---|---|---|
| 1 | 0 | 0 | 0 | 0 |
| 1 | 0 | 0 | 1 | 1 |
| 1 | 0 | 1 | 0 | 1 |
| 1 | 0 | 1 | 1 | 0 |
| 1 | 1 | 0 | 0 | 1 |
| 1 | 1 | 0 | 1 | 0 |
| 1 | 1 | 1 | 0 | 0 |
| 1 | 1 | 1 | 1 | 1 |
| 2 | 0 | 0 | 0 | 1 |
| 2 | 0 | 0 | 1 | 0 |
| 2 | 0 | 1 | 0 | 0 |
| 2 | 0 | 1 | 1 | 1 |
| 2 | 1 | 0 | 0 | 0 |
| 2 | 1 | 0 | 1 | 1 |
| 2 | 1 | 1 | 0 | 1 |
| 2 | 1 | 1 | 1 | 0 |

FIG. 2

| N=16; mode1_th=4; mode2_th=2 | | | | | | | | | | | | | | | | |
|---|---|---|---|---|---|---|---|---|---|---|---|---|---|---|---|---|
| i | 1 | 2 | 3 | 4 | 5 | 6 | 7 | 8 | 9 | 10 | 11 | 12 | 13 | 14 | 15 | 16 |
| c[i] | 0 | 1 | 0 | 1 | 0 | 1 | 0 | 1 | 0 | 0 | 0 | 0 | 0 | 0 | 0 | 0 |
| e[i] | 0 | 1 | 0 | 1 | 0 | 0 | 0 | 0 | 0 | 1 | 0 | 0 | 0 | 0 | 0 | 0 |
| mode | 1 | 1 | 1 | 1 | 1 | 2 | 2 | 2 | 2 | 2 | 2 | 1 | 1 | 1 | 1 | 1 |

FIG. 3

| i | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| c[i] | 0 | 0 | 0 | 0 | 0 | 0 | 0 | 0 | 1 | 0 | 1 | 0 | 1 | 0 | 1 | 0 |
| e[i] | 0 | 0 | 0 | 0 | 0 | 0 | 0 | 0 | 1 | 0 | 1 | 0 | 0 | 0 | 0 | 0 |
| mode | 1 | 1 | 1 | 1 | 1 | 1 | 1 | 1 | 1 | 1 | 1 | 1 | 2 | 2 | 2 | 2 |

N=16; mode1_th=4; mode2_th=2

FIG. 4

| i | 1 | 2 | 3 | 4 | 5 | 6 | 7 | 8 | 9 | 10 | 11 | 12 | 13 | 14 | 15 | 16 |
|---|---|---|---|---|---|---|---|---|---|----|----|----|----|----|----|----|
| c[i] | 0 | 0 | 0 | 0 | 0 | 0 | 0 | 0 | 0 | 0 | 0 | 0 | 0 | 0 | 0 | 0 |
| e[i] | 0 | 0 | 0 | 0 | 0 | 0 | 0 | 0 | 0 | 0 | 0 | 0 | 0 | 0 | 0 | 0 |
| mode | 1 | 1 | 1 | 1 | 1 | 1 | 1 | 1 | 1 | 1 | 1 | 1 | 1 | 1 | 1 | 1 |

N=16; mode1_th=4; mode2_th=2

FIG. 5

| N=16; mode1_th=4; mode2_th=3 | | | | | | | | | | | | | | | | |
|---|---|---|---|---|---|---|---|---|---|---|---|---|---|---|---|---|
| i | 1 | 2 | 3 | 4 | 5 | 6 | 7 | 8 | 9 | 10 | 11 | 12 | 13 | 14 | 15 | 16 |
| c[i] | 0 | 1 | 0 | 1 | 0 | 1 | 1 | 1 | 0 | 1 | 0 | 0 | 0 | 1 | 0 | 1 |
| e[i] | 0 | 1 | 0 | 1 | 0 | 0 | 1 | 0 | 0 | 0 | 0 | 1 | 0 | 0 | 0 | 0 |
| mode | 1 | 1 | 1 | 1 | 1 | 2 | 2 | 2 | 2 | 2 | 2 | 2 | 2 | 2 | 2 | 2 |

FIG. 6

| | | | | N=16, mode1_th=6, mode2_th=2; padding limit=3; tg_stop=3 | | | | | | | | | | | |
|---|---|---|---|---|---|---|---|---|---|---|---|---|---|---|---|---|
| c[i] | 0 | 1 | 0 | 1 | 0 | 1 | 0 | 1 | 0 | 1 | 1 | 1 | 0 | 1 | 0 | |
| e[i] | 0 | 1 | 0 | 1 | 0 | 1 | 1 | 0 | 1 | 1 | 1 | 0 | 0 | 1 | 0 | 1 |
| p[i] | 0 | 1 | 0 | 1 | 00 | 1 | 1 | 0 | 1 | 1 | 1 | 0 | 00 | 1 | 0 | 1 |

FIG. 11

| | N=16; mode1_th=6, mode2_th=2, padding limit=2; tg_stop=3 | | | | | | | | | | | | | | | |
|---|---|---|---|---|---|---|---|---|---|---|---|---|---|---|---|---|
| c[i] | 0 | 1 | 0 | 1 | 1 | 1 | 0 | 1 | 1 | 1 | 0 | 1 | 1 | 0 | 0 | 0 |
| e[i] | 0 | 1 | 0 | 1 | 1 | 1 | 0 | 1 | 0 | 1 | 0 | 1 | 1 | 0 | 0 | 1 |
| p[i] | 0 | 1 | 0 | 1 | 1 | 1 | 00 | 1 | 00 | 1 | 0 | 1 | 1 | 0 | 0 | 1 |

FIG. 12

| sleep_th=16; dsleep_th=63; sleep_pad=1; dsleep_pad=3; sleep_pad_limit=12 | | | | | | |
|---|---|---|---|---|---|---|
| c[i] | 63{0} | 0 | 0 | 1 | 1 | 16{1} | 0 | 0 |
| h[i] | 63{0} | 0 | 0 | 4{1} | 1 | 16{1} 2{0} | 0 | 0 |

FIG. 15

| sleep_th=16; dsleep_th=63; sleep_pad=1; dsleep_pad=3; sleep_pad_limit=3 | | | | | | | | |
|---|---|---|---|---|---|---|---|---|
| c[i] | 63{0} | 0 | 0 | 1 | 1 | 16{1} | 0 | 0 | 0 |
| h[i] | 63{0} | 0 | 0 | 4{1} | 1 | 16{1} | 0 | 0 | 0 |

| | N=16; dsleep_pad=2; dsleep_th=6; sleep_pad=1; sleep_th=2 | | | | | | | | | | | | | | | |
|---|---|---|---|---|---|---|---|---|---|---|---|---|---|---|---|---|
| c[i] | 0 | 0 | 0 | 0 | 0 | 0 | 0 | 0 | 0 | 1 | 1 | 0 | 0 | 0 | 1 | 1 |
| e[i] | 0 | 0 | 0 | 0 | 0 | 0 | 0 | 0 | 0 | 1 | 1 | 0 | 0 | 0 | 1 | 1 |
| p[i] | 0 | 0 | 0 | 0 | 0 | 0 | 0 | 0 | 0 | 1 | 1 | 0 | 0 | 0 | 1 | 1 |
| h[i] | 0 | 0 | 0 | 0 | 0 | 0 | 0 | 0 | 3{1} | 1 | 2{0} | 0 | 0 | 0 | 3{1} | 1 |

DATA ENCODING/DECODING METHOD AND RELATED DEVICE CAPABLE OF LOWERING SIGNAL POWER SPECTRAL DENSITY

BACKGROUND OF THE INVENTION

1. Field of the Invention

The present invention relates to a data encoding/decoding method and related device capable of lowering signal power spectral density, and more particularly, to a data encoding/decoding method and related device capable of performing encoding mode switching without extra signal pins and performing dummy bit stuffing adaptively according to practical data pattern for lowering signal power spectral density of transmitted data.

2. Description of the Prior Art

With the advancement of the semiconductor technology, switching speed and efficiency of transistors are enhanced without end, such that data quantity capable of being processed every unit time by integrated circuit (IC) chips increases day by day. Thus, there should be an effective data transmission system for realizing data transmission among various kinds of IC chips. Currently, binary data transmission systems can roughly be divided into two kinds: One is to transmit data signals in the form of single-ended voltages, such as a transistor-transistor logic (TTL) interface, and the other is to transmit data signals in the form of double-ended differential voltages or currents, such as a low voltage differential signal (LVDS) interface, a reduced swing differential signal (RSDS) interface and a mini low voltage differential signal (mini-LVDS) Interface, etc.

Since digital data transmitted in the binary data transmission system alternates between 0 and 1, electronic signals carried on signal transmission lines of the binary data transmission system also swings up and down unceasingly. Thus, harmonics of the electronic signals existing on the signal transmission lines, which respectively belong to different frequency bands, are easily radiated in the form of electromagnetic waves through antenna effects of the data transmission system, resulting in that problems of electromagnetic Interference (EMI) and electromagnetic compatibility (EMC) can not be ignored. Therefore, in order to improve the above-mentioned problems, one general solution is to reduce the number of times that the transmitted data consecutively alternates between 0 and 1 as much as possible. However, in the prior arts, such doings often costs a lot of extra system expenses, for example, if encoding data being transmitted by a transition minimized differential signaling (TMDS) encoding method, two redundant bits (or called overheads) need to be padded into every 8 data bits being transmitted, and the number of the padded redundant bits cannot be adjusted adaptively according to data patterns of the transmitted data.

On the other hand, as a method disclosed in U.S. Pat. No. 6,628,256, extra signal pins are needed for indicating current encoding modes or status of the transmitted data. Thus, in this case, not only system costs are increased, but also safety requirements cannot be met since voltage swings of the extra signal pins are also easy to excite electromagnetic wave radiation.

SUMMARY OF THE INVENTION

It is therefore a primary objective of the present invention to provide a data encoding/decoding method capable of lowering signal power spectral density.

The present invention discloses an encoding method for a binary data transmission system. The method comprises receiving a binary data, utilizing a first encoding mode to encode the binary data, switching to utilize a second encoding mode to encode data that has not been encoded in the binary data when the number of bit value consecutive variation times of an encoding result corresponding to the first encoding mode reaches a first threshold value, and outputting an encoding result corresponding to the first encoding mode and the second encoding mode.

The present invention further discloses an encoding method for a binary data transmission system. The method comprises receiving a binary data, stuffing a predetermined number of dummy bits next to a corresponding bit for generating an encoding result according to the number of consecutively stationary bits of the binary data when a bit value of the consecutively stationary bits changes, and outputting the encoding result.

The present invention further discloses an encoding method capable of lowering signal power spectral density for a binary data transmission system. The method comprises receiving a binary data, performing an adaptive mode tracking encoding for the binary data to generate a first encoding result, performing a dummy bit stuffing encoding for the first encoding result to generate a second encoding result, performing a bit stationary state resuming encoding for the second encoding result to generate a third encoding result, and outputting the third encoding result.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 shows a truth table corresponding to a first encoding mode and a second encoding mode of the adaptive mode tracking encoding of the present invention.

FIG. 3 is a schematic diagram of an embodiment of the adaptive mode tracking encoding of the present invention.

FIG. 4~FIG. 6 are schematic diagrams of other embodiments of the adaptive mode tracking encoding of the present invention.

FIG. 11 and FIG. 12 are two embodiments of the bit stuffing encoding of the present invention.

FIG. 15~FIG. 17 are schematic diagrams of embodiments of the bit stationary state resuming encoding of the present invention.

DETAILED DESCRIPTION

Figure 1:
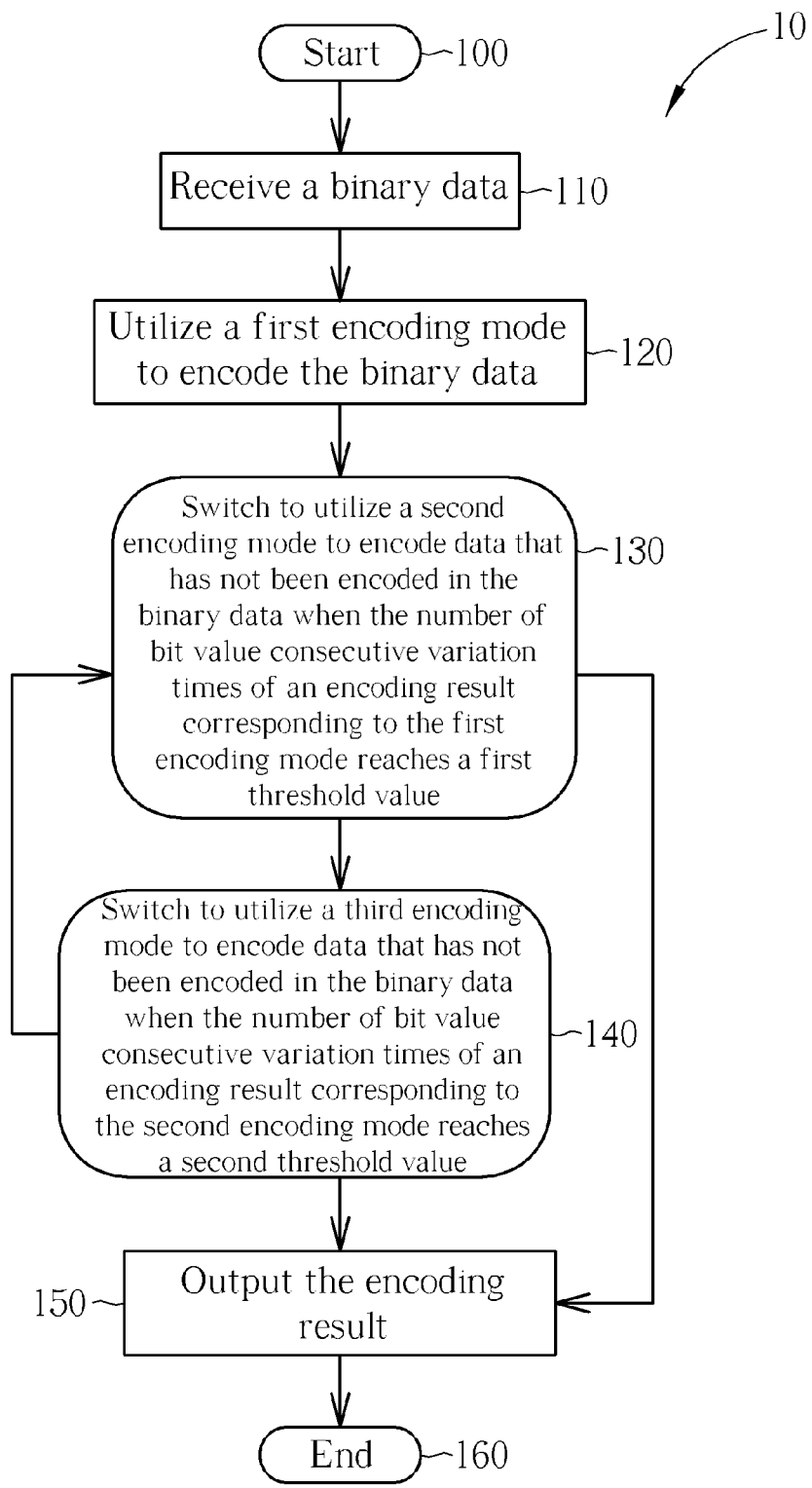
FIG. 1 is a schematic diagram of an encoding process according to adaptive mode tracking encoding of the present invention.

Adaptive Mode Tracking Encoding/Decoding:

Please refer to FIG. 1. FIG. 1 is a schematic diagram of an encoding process 10 according to adaptive mode tracking encoding (AMTE) of the present invention. The encoding process 10 is utilized in a binary data transmission system, and comprises the following steps:

Step 100: Start.
Step 110: Receive a binary data.
Step 120: Utilize a first encoding mode to encode the binary data.
Step 130: Switch to utilize a second encoding mode to encode data that has not been encoded in the binary data when the number of bit value consecutive variation times of an encoding result corresponding to the first encoding mode reaches a first threshold value.
Step 140: Switch to utilize a third encoding mode to encode data that has not been encoded in the binary data when the number of bit value consecutive variation times of an encoding result corresponding to the second encoding mode reaches a second threshold value.
Step 150: Output the encoding result.
Step 160: End.

According to the encoding process 10, after receiving the binary data, the adaptive mode tracking encoding of the present invention first utilizes the first encoding mode to encode the binary data, and then switches to utilize the second encoding mode to encode data that has not been encoded in the binary data when the number of bit value consecutive variation times of the encoding result corresponding to the first encoding mode reaches the first threshold value. Similarly, when the number of bit value consecutive variation times of the encoding result corresponding to the second encoding mode reaches the second threshold value, the adaptive mode tracking encoding of the present invention switches to utilize the third encoding mode to encode data that has not been encoded in the binary data. Preferably, the third encoding mode is equal to the first encoding mode.

In addition, the first encoding mode is preferably applied when bit values of the binary data are on a consecutive stationary state, and has the following encoding rules: When a bit value of a current bit of the binary data is equal to that of a prior bit of the binary data, a bit with a bit value equal to that of a prior bit of the encoding result is outputted; and conversely, when a bit value of the current bit of the binary data is not equal to that of the prior bit of the binary data, the bit with a bit value not equal to that of the prior bit of the encoding result is outputted. On the other hand, the second encoding mode is preferably applied when bit values of the binary data are on a consecutive variation state, and has the following encoding rules: When a bit value of a current bit of the binary data is equal to that of a prior bit of the binary data, a bit with a bit value not equal to that of a prior bit of the encoding result is outputted; and conversely, when the bit value of the current bit of the binary data is not equal to that of the prior bit of the binary data, the bit with a bit value equal to that of the prior bit of the encoding result is outputted. Note that a bit value of a first bit of the encoding result is equal to that of a first bit of the binary data.

Assuming that $c[i-1]$ and $c[i]$ respectively represent bit values of a $(i-1)^{th}$ bit and an $i^{th}$ bit of the binary data, $e[i-1]$ and $e[i]$ respectively represent bit values of a $(i-1)^{th}$ bit and an $i^{th}$ bit of the encoding result, the encoding result corresponding to the first encoding mode can then be expressed by the following formula:

$$e[i]=(c[i] \text{XOR } c[i-1]) \text{ XOR } e[i-1],$$

wherein "XOR" represents an exclusive OR logic operation and the value of "i" is larger than 1. On the other hand, the encoding result corresponding to the second encoding mode can be expressed as:

$$e[i]=(c[i] \text{XOR } c[i-1]) \text{ XNOR } e[i-1],$$

wherein "XNOR" represents an exclusive NOR logic operation and the value of "i" is larger than 1. Please refer to FIG. 2, which shows a truth table of the above two formulas corresponding to the first encoding mode and the second encoding mode, respectively.

Please refer to FIG. 3. FIG. 3 is a schematic diagram of an embodiment of the adaptive mode tracking encoding of the present invention, in which $c[i]$ and $e[i]$ respectively represent the binary data and the encoding result, mode1_th and mode2_th respectively represent the first threshold value and the second threshold value and "N" represents the number of bits in the binary data. As mentioned above, when performing the adaptive mode tracking encoding for the binary data $c[i]$ according to the encoding process 10, the present invention firstly utilizes the first encoding mode to encode the received binary data $c[i]$, and then switches to utilize the second encoding mode to encode data that has not been encoded in the binary data $c[i]$ when the number of bit value consecutive variation times of the encoding result $e[i]$ corresponding to the first encoding mode reaches the first threshold value mode1_th. Next, when the number of bit value consecutive variation times of the encoding result $e[i]$ corresponding to the second encoding mode reaches the second threshold value mode2_th, the present invention then switches back to the first encoding mode for encoding the following binary data $c[i]$. In like manners, the present invention can repeat such encoding mode switching operations until all bits of the binary data $c[i]$ are encoded completely.

In this case, the first threshold value mode1_th and the second threshold value mode2_th are set to be 4 and 2, respectively. As shown in FIG. 3, when encoding to a $5^{th}$ bit $c[5]$ of the binary data $c[i]$ by the first encoding mode, the number of bit value consecutive variation times of the encoding result $e[i]$ corresponding to the first encoding mode reaches the first threshold value mode1_th, and thus the encoding mode is switched to the second encoding mode for encoding the following binary data $c[i]$. Similarly, when encoding to a $11^{th}$ bit $c[11]$ of the binary data $c[i]$ by the second encoding mode, the encoding mode is then switched back to the first encoding mode since the number of bit value consecutive variation times of the encoding result $e[i]$ corresponding to the second encoding mode (i.e. bits $e[7]$~$e[11]$) reaches the second threshold value mode2_th.

Thus, by the adaptive mode tracking encoding, the present invention can track the bit value variation status of the binary data $c[i]$, and can automatically switch to a most suitable encoding mode, so that the number of times that the encoding result $e[i]$ alternates between 0 and 1 can be reduced significantly. For example, bits $c[1]$~$c[9]$ of the binary data $c[i]$ are on the consecutive variation state, which is suitable to be encoded by the second encoding mode for reducing the bit value variation times, and thus when the number of bit value consecutive variation times of the encoding result $e[i]$ corresponding to the first encoding mode reaches the first threshold value mode1_th, the encoding mode is automatically switched to the second encoding mode for encoding the binary data $c[i]$. Similarly, bits $c[9]$~$c[16]$ of the binary data $c[i]$ are on the consecutive stationary state, which is suitable to be encoded by the first encoding mode, and thus when the number of bit value consecutive variation times of the encoding result $e[i]$ corresponding to the second encoding mode reaches the second threshold value mode2_th, the encoding mode is then switched back to the first encoding mode for encoding the remaining binary data $c[i]$ as shown in FIG. 3. Therefore, compared with the prior art, the present invention does not need extra signal pins for indicating the current encoding mode or the encoding mode switching, so that system expense and production cost can be saved effectively.

Please note that the first threshold value mode1_th and the second threshold value mode2_th mentioned above can be appropriately adjusted according to practical data patterns, and are not restricted in any specific values. Please continue to refer to FIG. 4~FIG. 6. FIG. 4~FIG. 6 are schematic diagrams of other embodiments of the adaptive mode tracking encoding of the present invention. FIG. 4 illustrates an encoding result $e[i]$ and corresponding encoding mode switching when bit values of a binary data $c[i]$ vary from the consecutive stationary state to the consecutive variation state. As shown in FIG. 4, bit values of the binary data $c[1]$~$c[8]$ are on the stationary state, and bit values of the binary data $c[9]$~$c[16]$ are on consecutive variation state. Since the binary data $c[i]$ is firstly encoded by the first encoding mode, bit values of the encoding result $e[1]$~$e[8]$ are on the stationary state as the bit values of the binary data $c[1]$~$c[8]$, and bit values of the encoding result $e[9]$~$e[12]$ are also on the consecutive variation state as the bit values of the binary data $c[9]$~$c[12]$. However, when encoding to a $13^{th}$ bit $c[13]$ of the binary data $c[i]$, the consecutive variation state is tracked according to the number of bit value consecutive variation times of the encoding result $e[i]$, so that the encoding mode is automatically switched to the second encoding mode. As a result, bit values of the encoding result $e[13]$~$e[16]$ are changed to the stationary state in comparison with the binary data $c[13]$~$c[16]$ as shown in FIG. 4.

Similarly, please refer to FIG. 5, FIG. 5 illustrates an encoding result $e[i]$ and corresponding encoding mode switching when bit values of a binary data $c[i]$ are all on the stationary state. As shown in FIG. 5, since the bit values of the binary data $c[i]$ are all stationary and are firstly encoded by the first encoding mode, which is suitable for the consecutive stationary state, encoding mode switching does not occur and the bit values of the encoding result $e[i]$ are also kept on the consecutive stationary state. Please further refer to FIG. 6, which illustrates an encoding result $e[i]$ and corresponding encoding mode switching when bit values of a binary data $c[i]$ are temporarily on the stationary state after the encoding mode is switched to the second encoding mode. As shown in FIG. 6, bit values of the binary data $c[1]$~$c[5]$ are on the consecutive variation state, and thus the encoding mode is switched to the second encoding mode when the number of bit value consecutive variation times of the encoding result $e[i]$ corresponding to the first encoding mode reaches the first threshold value mode1_th. At this time, when bit values of the binary data $c[i]$ are temporarily on the stationary state, such as the binary data $c[6]$~$c[8]$ and $c[11]$~$c[13]$, the encoding mode is also kept to be the second encoding mode since the number of bit value consecutive variation times of the encoding result $e[i]$ does not reach the second threshold value mode2_th yet.

Figure 7:
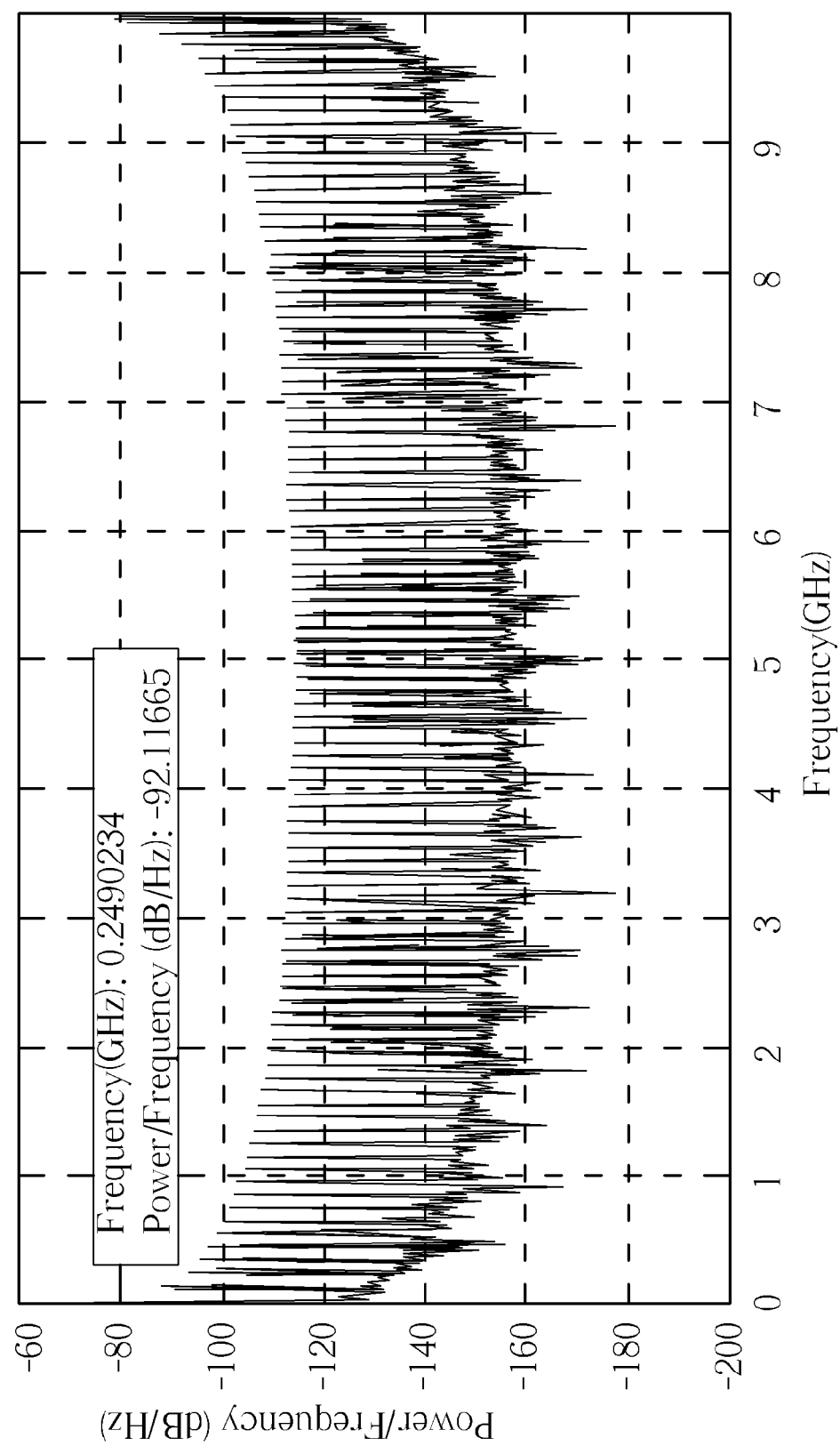
FIG. 7 and FIG. 8 are schematic diagrams of power spectral density corresponding to binary data and before and after encoded by the adaptive mode tracking encoding of the present invention, respectively.
Figure 8:
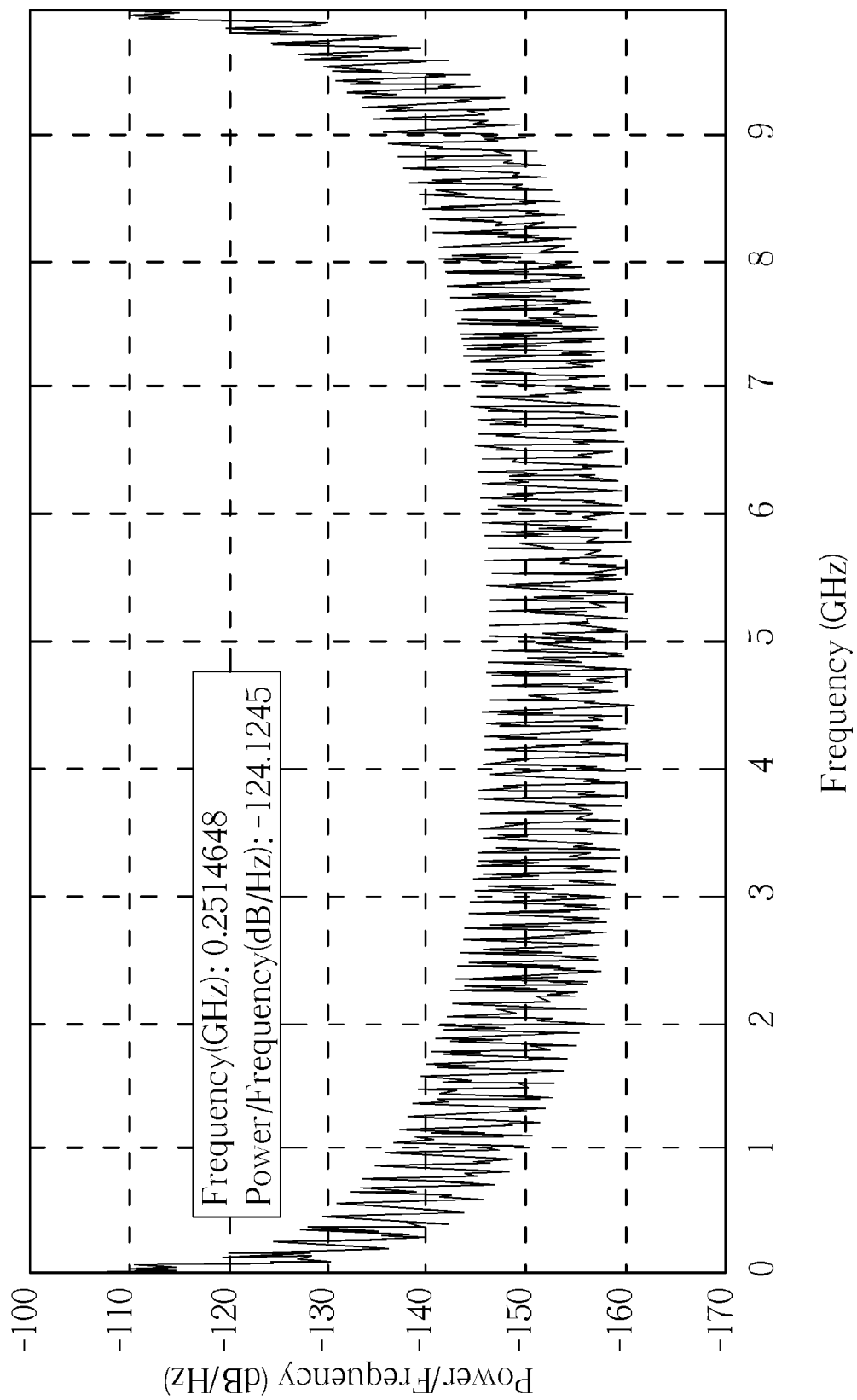

Therefore, by the adaptive mode tracking encoding, the present invention can significantly reduce the number of times that the transmitted data alternates between 0 and 1, so as to lower power spectral density (PSD) of electronic signals carried on bus lines of a data transmission system. Please refer to FIG. 7 and FIG. 8. FIG. 7 and FIG. 8 are schematic diagrams of power spectral density corresponding to binary data $c[i]$ and $e[i]$ before and after being encoded by the AMTE method of the present invention, respectively, in which the binary data $c[i]$ has a data pattern with 0/1 alternating consecutively, i.e. the so called consecutive variation state. In this case, taking 100 bits transmitted in the form of square waves for example (N=100), if a bit rate Rb is set to be 100 Mbps, a sampling rate Fs is 100 multiples of the bit rate and a Welch PSD estimation method (well-known by those in the art) is used, power density peaks corresponding to each frequency band are all significantly lowered in comparison with the power spectral densities corresponding to the binary data $c[i]$ and $e[i]$ in FIG. 7 and FIG. 8. Especially, when the number of bits being transmitted increases, the peak values of the power densities corresponding to the encoded binary data $e[i]$ can be lowered more significantly.

Figure 9:
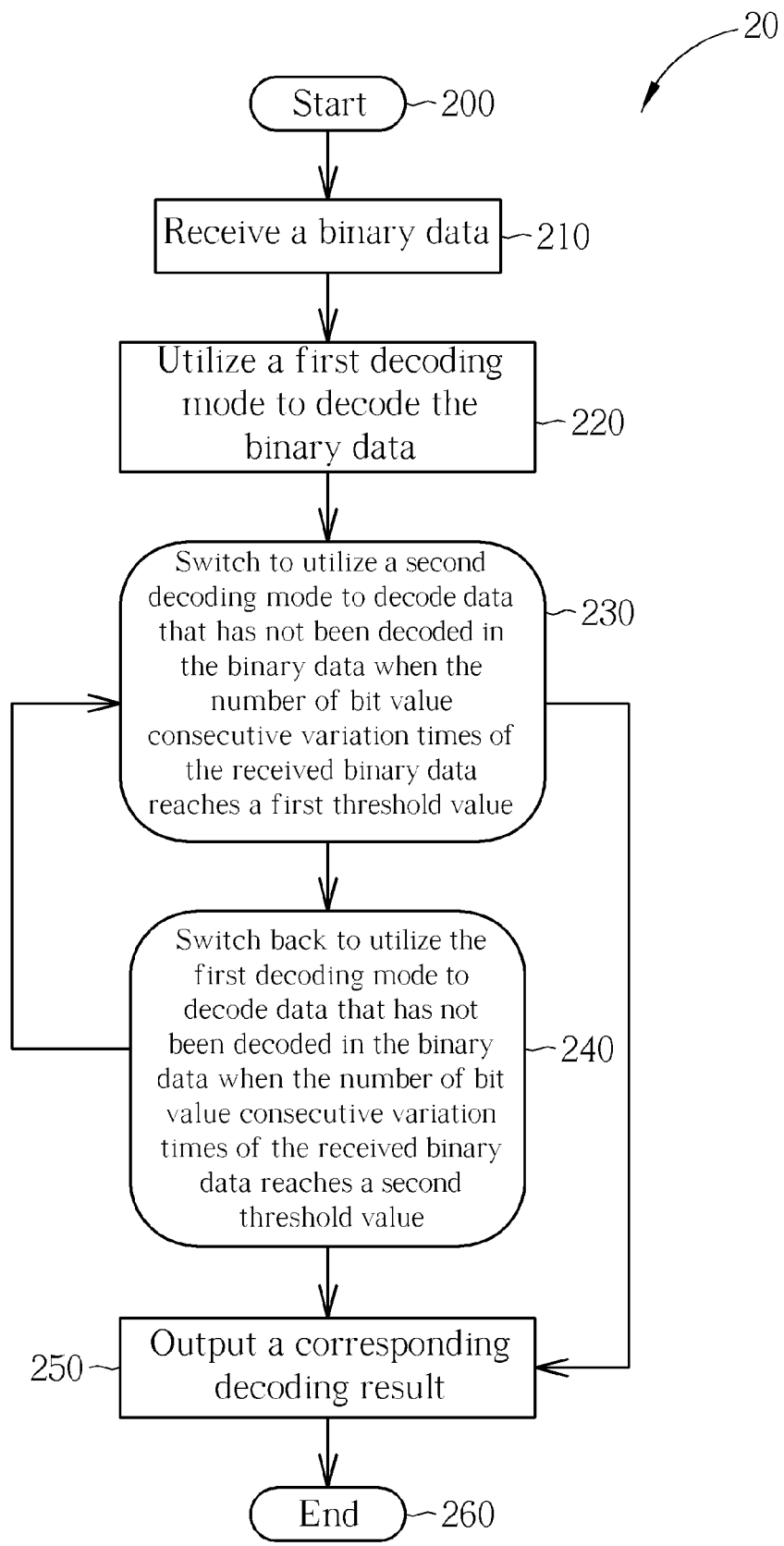
FIG. 9 is a schematic diagram of a decoding process according to adaptive mode tracking decoding of the present invention.

Besides, since the encoding mode is automatically switched according to the bit value consecutive variation times, the present invention can also perform corresponding decoding for a received binary data by the same rules. Please refer to FIG. 9. FIG. 9 is a schematic diagram of a decoding process 20 according to an adaptive mode tracking decoding of the present invention. The decoding process 20 is corresponding to the encoding process 10, and comprises the following steps:

Step 200: Start.

Step 210: Receive a binary data.

Step 220: Utilize a first decoding mode to decode the binary data.

Step 230: Switch to utilize a second decoding mode to decode data that has not been decoded in the binary data when the number of bit value consecutive variation times of the received binary data reaches a first threshold value.

Step 240: Switch back to utilize the first decoding mode to decode data that has not been decoded in the binary data when the number of bit value consecutive variation times of the received binary data reaches a second threshold value.

Step 250: Output a corresponding decoding result.

Step 260: End.

According to the decoding process 20, after receiving the binary data, the present invention firstly utilizes the first decoding mode to decode the binary data, among which a bit value of a first bit of the corresponding decoding result is preferably set equal to that of the received binary data. When the number of bit value consecutive variation times of the received binary data reaches the first threshold value, the present invention then switches to utilize the second decoding mode to decode data that has not been decoded in the binary data. Next, when the number of bit value consecutive variation times of the received binary data reaches the second threshold value, the present invention switches back to the first decoding mode to decode the following binary data. In like manners, such decoding mode switching operations can be repeated until all bits of the received binary data are decoded completely. Note that the first decoding mode and the second decoding mode are corresponding to the first encoding mode and the second encoding mode mentioned above, respectively. Thus, the decoding operations are similar to that of the first encoding mode and the second encoding mode, and are not narrated again herein.

Therefore, by the decoding process 20, the present invention can automatically switch to the appropriate decoding mode for decoding the received binary data according to the bit value consecutive variation times, so as to save extra signal pins for indicating the desired decoding mode. That means, when the received binary data is the above-mentioned encoding result e[i], and the first threshold value and the second threshold value are set equal to that in the encoding process, the encoding result e[i] can then be returned to the corresponding original binary data c[i] after performing the decoding process 20.

As mentioned above, the adaptive mode tracking encoding/decoding method of the present invention not only can significantly reduce the number of times that the transmitted data alternates between 0 and 1, but can also automatically track to the most suitable encoding mode according to the bit value consecutive variation status. Therefore, compared with the prior art, the present invention does not need extra signal pins for indicating the current encoding mode state or the encoding mode switching, so as to save system expense and production cost effectively.

Figure 10:
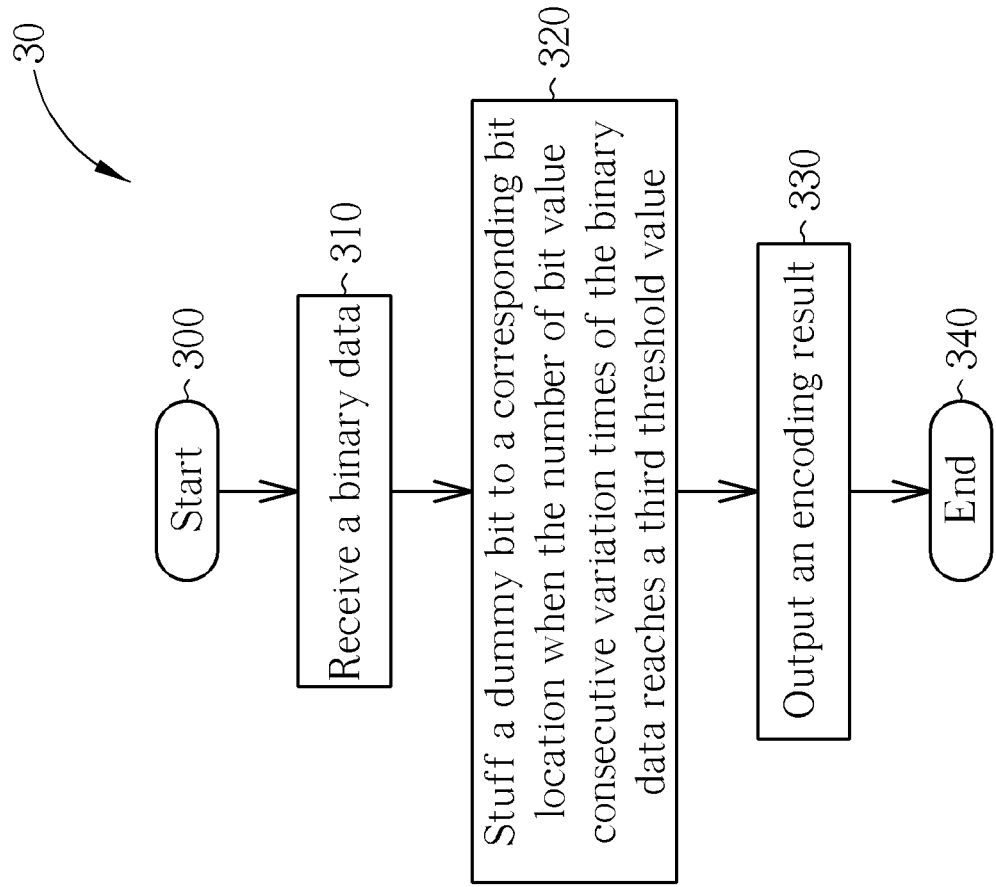
FIG. 10 is a schematic diagram of an encoding process according to bit stuffing encoding of the present invention.

Bit Stuffing Encoding/Decoding:

Please refer to FIG. 10. FIG. 10 is a schematic diagram of an encoding process 30 according to a bit stuffing encoding of the present invention. The encoding process 30 is utilized in a binary data transmission system, and comprises the following steps:

Step 300: Start.

Step 310: Receive a binary data.

Step 320: Stuff a dummy bit to a corresponding bit location when the number of bit value consecutive variation times of the binary data reaches a third threshold value.

Step 330: Output an encoding result.

Step 340: End.

According to the encoding process 30, after receiving the binary data, the bit stuffing encoding method of the present invention stuffs a dummy bit to a corresponding bit location when the number of bit value consecutive variation times of the binary data reaches the third threshold value, and then outputs the corresponding encoding result until all bits of the binary data are encoded completely. Preferably, the present invention stops stuffing the dummy bits into the binary data when the number of the stuffed dummy bits reaches an upper limit value. Thus, for the binary data with consecutively alternated bit values, the number of bit value consecutive variation times can be interrupted by stuffing the dummy bits, so as to eliminate occurrence of electromagnetic noises when transmitting the binary data.

Preferably, the bit stuffing encoding method of the present invention can be used as an auxiliary for the above-mentioned adaptive mode tracing encoding method. For example, please refer to FIG. 11 and FIG. 12. FIG. 11 and FIG. 12 are two embodiments of the bit stuffing encoding of the present invention, in which c[i] and e[i] respectively represent an original binary data and an encoding result corresponding to the adaptive mode tracking encoding method, tg_stop and padding_limit respectively represent the third threshold value and the upper limit value and p[i] represents an encoding result corresponding to the bit stuffing encoding. For some specific data pattern as the binary data c[i] shown in FIG. 11, bit values of the encoding result e[i] generated by performing the adaptive mode tracking encoding for the binary data c[i] are still on the consecutive variation state. Thus, in order to ease the bit value consecutive variation status, the present invention can stuff a dummy bit next to a corresponding bit when the number of bit value consecutive variation times of the encoding result e[i] reaches the third threshold value tg_stop, of which a bit value of the dummy bit is equal to that of the corresponding bit. As shown in FIG. 11, after dummy bits are individually stuffed next to bits e[5], e[9] and e[13], the bit value consecutive variation status of the encoding result e[i] can be improved effectively. Please further refer to FIG. 12, which illustrates a case that stops stuffing the dummy bits when the number of stuffed dummy bits reaches the upper limit value padding_limit. In the embodiment, all parameters are set the same as that in FIG. 11 except the upper limit value padding_limit is adjusted to be 2. Thus, as shown in FIG. 12, even if the number of bit value consecutive variation times corresponding to bits e[10]~e[16] reaches the third threshold value tg_stop, there are no dummy bits being stuffed into the encoding result e[i] since the number of the stuffed dummy bits has already reached the upper limit value padding_limit. Please note that the third threshold value tg_stop and the upper limit value padding_limit can both be adjusted adaptively according to practical demands, and are not restricted herein.

Figure 13:
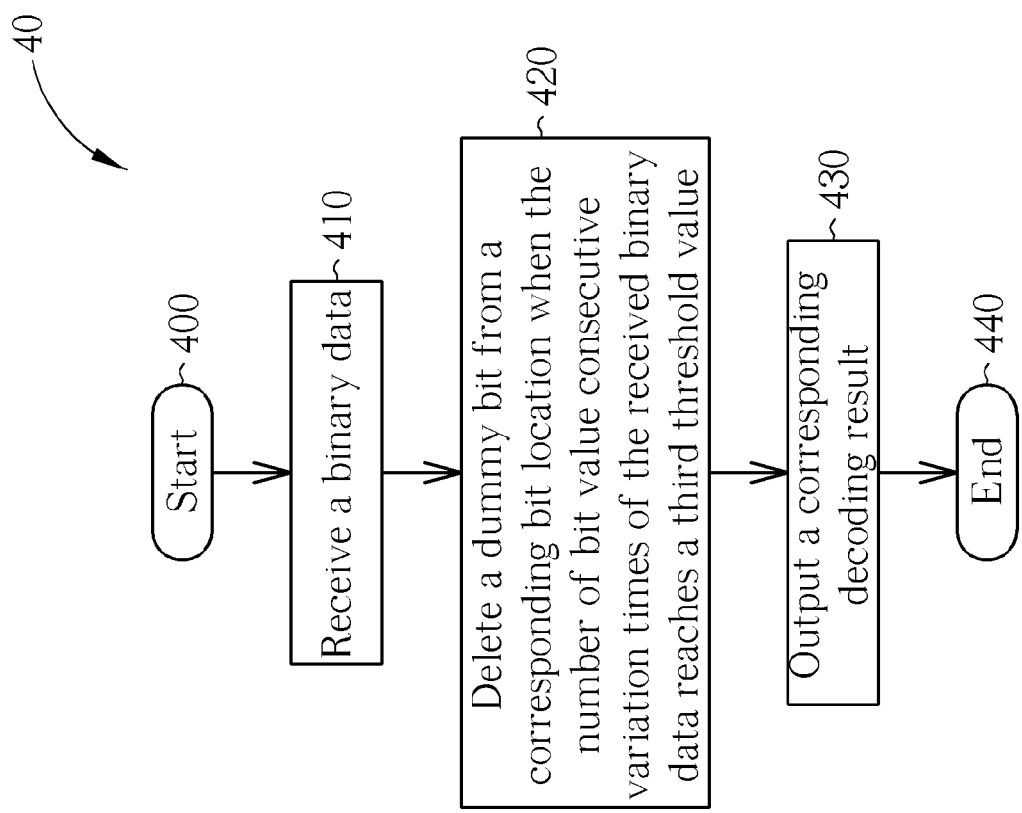
FIG. 13 is a schematic diagram of a decoding process according to bit stuffing decoding of the present invention.

Besides, since the bit stuffing encoding of the present invention individually stuffs the dummy bits next to the corresponding bits according to the bit value consecutive variation times, the present invention can also perform corresponding decoding for a received binary data by the same rules. Please refer to FIG. 13. FIG. 13 is a schematic diagram of a decoding process 40 according to bit stuffing decoding method of the present invention. The decoding process 40 is corresponding to the encoding process 30, and comprises the following steps:

Step 400: Start.

Step 410: Receive a binary data.

Step 420: Delete a dummy bit from a corresponding bit location when the number of bit value consecutive variation times of the received binary data reaches a third threshold value.

Step 430: Output a corresponding decoding result.

Step 440: End.

According to the decoding process 40, after receiving the binary data, the bit stuffing decoding of the present invention deletes a dummy bit from a corresponding bit location when the number of bit value consecutive variation times of the received binary data reaches the third threshold value, and then generates the corresponding decoding result. In addition, when the number of deleted dummy bits reaches an upper limit value, the present invention stops deleting dummy bits from the received binary data. Preferably, if the binary data is the above-mentioned encoding result p[i] and the third threshold value and the upper limit value are set equal to the third threshold value tg_stop and the upper limit value padding_limit in the encoding process 30, the received binary data p[i] can then be reversed to the original binary data e[i] after performing the decoding process 40.

Therefore, when bit values of the binary data are still on the consecutive variation state, the present invention can further reduce the number of bit value consecutive variation times by stuffing the dummy bits, so as to suppress electromagnetic noises generated by transmitting the binary data. Preferably, the bit stuffing encoding of the present invention can be used as an auxiliary for the above-mentioned adaptive mode tracking encoding for effectively lowering the signal power spectral density when transmitting data in the binary data transmission system.

Figure 14:
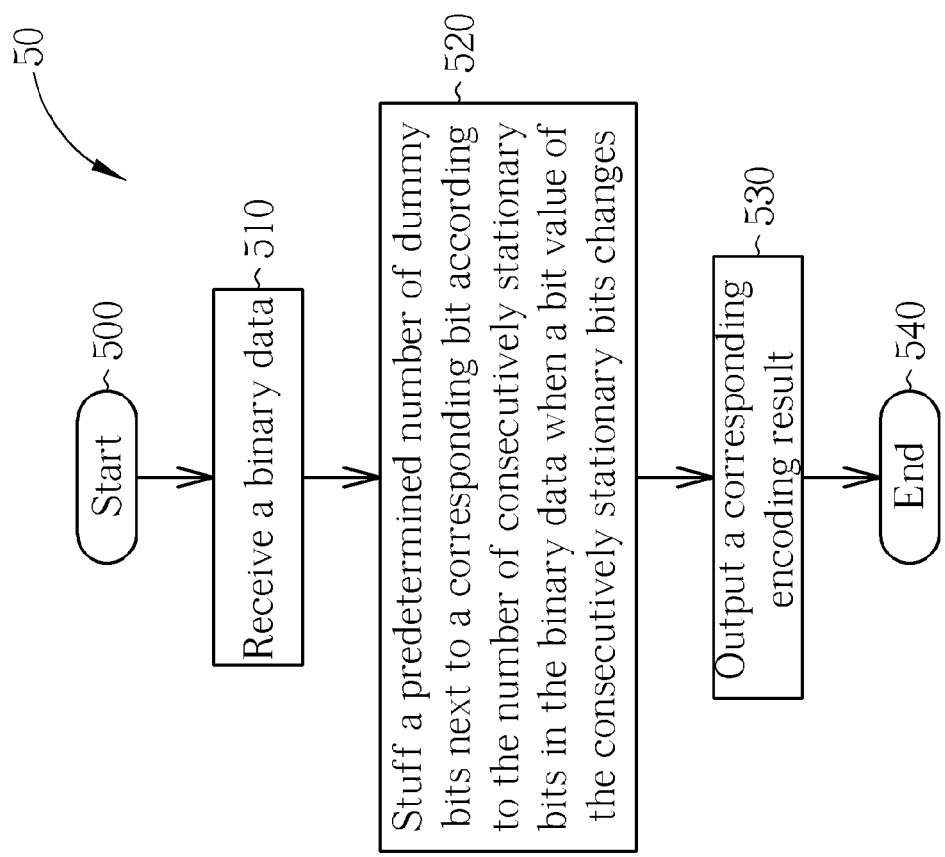
FIG. 14 is a schematic diagram of an encoding process according to bit stationary state resuming encoding of the present invention.

Bit Stationary State Resuming Encoding/Decoding:

Please refer to FIG. 14. FIG. 14 is a schematic diagram of an encoding process 50 according to bit stationary state resuming encoding of the present invention. The encoding process 50 is utilized in a binary data transmission system, and comprises the following steps:

Step 500: Start.

Step 510: Receive a binary data.

Step 520: Stuff a predetermined number of dummy bits next to a corresponding bit according to the number of consecutively stationary bits in the binary data when a bit value of the consecutively stationary bits changes.

Step 530: Output a corresponding encoding result.

Step 540: End.

According to the encoding process 50, after receiving the binary data, the bit stationary state resuming encoding of the present invention stuffs a predetermined number of dummy bits next to a corresponding bit according to the number of consecutively stationary bits in the binary data when a bit value of the consecutively static bits changes, among which a bit value of the predetermined number of dummy bits is equal to that of the corresponding bit, and then outputs the corresponding encoding result until all bits of the binary data are encoded completely. In addition, when the number of stuffed dummy bits is greater than an upper limit, the present invention then stops stuffing dummy bits into the binary data.

Preferably, the present invention can preset a fourth threshold value and a fifth threshold value, among which the fourth threshold value is smaller than the fifth threshold value. In this case, when the bit value of the consecutively stationary bits changes, the present invention stuffs a first predetermined number of dummy bits next to a corresponding bit if the number of the consecutively stationary bits exceeds the fourth threshold value but not reaches the fifth threshold value, or otherwise stuffs a second predetermined number of dummy bits if the number of the consecutively stationary bits exceeds the fifth threshold value.

In other words, when bit values of the received binary data vary from one bit value stationary state to the other bit value stationary state or to a temporarily stationary state, the present invention can stuff the first or second predetermined number of dummy bits into the corresponding bit location according to the number of the consecutively stationary bits for preventing transient variation of the bit value stationary state raising the signal power spectral density of the transmitted data, so as further to eliminate interference of high frequency noises.

Please refer to FIG. 15~FIG. 17. FIG. 15~FIG. 17 are schematic diagrams of embodiments of the bit stationary state resuming encoding of the present invention, in which c[i] and h[i] respectively represent an ordinary binary data and an encoding result corresponding to the bit stationary state resuming encoding, sleep_th and dsleep_th respectively represent the fourth threshold value and the fifth threshold value, sleep_pad and dsleep_pad respectively represent the first predetermined number and the second predetermined number and sleep_pad_limit represents the upper limit value of the number of dummy bits capable of being stuffed in the binary data c[i]. As shown in FIG. 15, when bit values of the binary data c[i] vary from one bit value stationary state to the other bit value stationary state (i.e. the bit values of the binary data c[i] vary), the second predetermined number of dummy bits dsleep_pad needs to be stuffed next to the corresponding bits (i.e. a bit c[67]) since the number of consecutively stationary bits already exceeds the fifth threshold value dsleep_th. Similarly, when the bit value consecutive stationary state varies again (i.e. the bit values of the binary data c[i] vary), the number of consecutively stationary bits c[67]~c[84] exceeds the fourth threshold value sleep_th but not reach the fifth threshold value dsleep_th, and thus the first predetermined number of dummy bits sleep_pad is then stuffed next to the corresponding bits (i.e. a bit c[85]). Finally, the present invention outputs the corresponding encoding result h[i] with the stuffed dummy bits for preventing the transient variation of the bit value stationary state increasing the signal power spectral density. Please further refer to FIG. 16, which illustrates a case that stop stuffing dummy bits when the number of the stuffed dummy bits is greater than the upper limit value sleep_pad_limit. In FIG. 16, all related parameters are set the same as that in FIG. 15 except that the upper limit value sleep_pad_limit is adjusted to be 3. In the embodiment, since the number of stuffed dummy bits already exceeds the upper limit value sleep_pad_limit, no dummy bits can be stuffed anymore when the bit value stationary state varies from one to the other, even the number of consecutively stationary bits c[67]~c[84] already exceeds the fourth threshold value sleep_th. Please note that all of the related parameters mentioned above can be adjusted adaptively according to practical demands, and are not restricted herein.

On the other hand, please refer to FIG. 17, in which e[i] and p[i] respectively represent encoding results corresponding to the adaptive mode tracking encoding and the dummy bit stuffing encoding. In the embodiment, when bit values of an original binary data c[i] vary from one bit value stationary state to a temporarily stationary state, the encoding results e[i] and p[i] respectively corresponding to the adaptive mode tracking encoding and the dummy bit stuffing encoding are still the same as the original binary data c[i] since the number of bit value consecutive variation times is equal to 1. Thus, by the bit stationary state resuming encoding, the present invention can stuff the first or second predetermined number of dummy bits next to a corresponding bit according to the number of consecutively stationary bits when the bit value of the consecutively stationary bits changes for lowering the signal power spectral density when transmitting data with such kind of data pattern. As shown in FIG. 17, when bit values of the binary data c[i] vary from bit value stationary states to temporarily stationary states (i.e. bits c[6]~c[7] and bits c[14]~c[15]), the two transient states of the binary data c[i] can then be extended by stuffing the second predetermined number of dummy bits dsleep_pad into corresponding bit locations, so that the power spectral density with such kinds of data pattern can be lowered.

Figure 18:
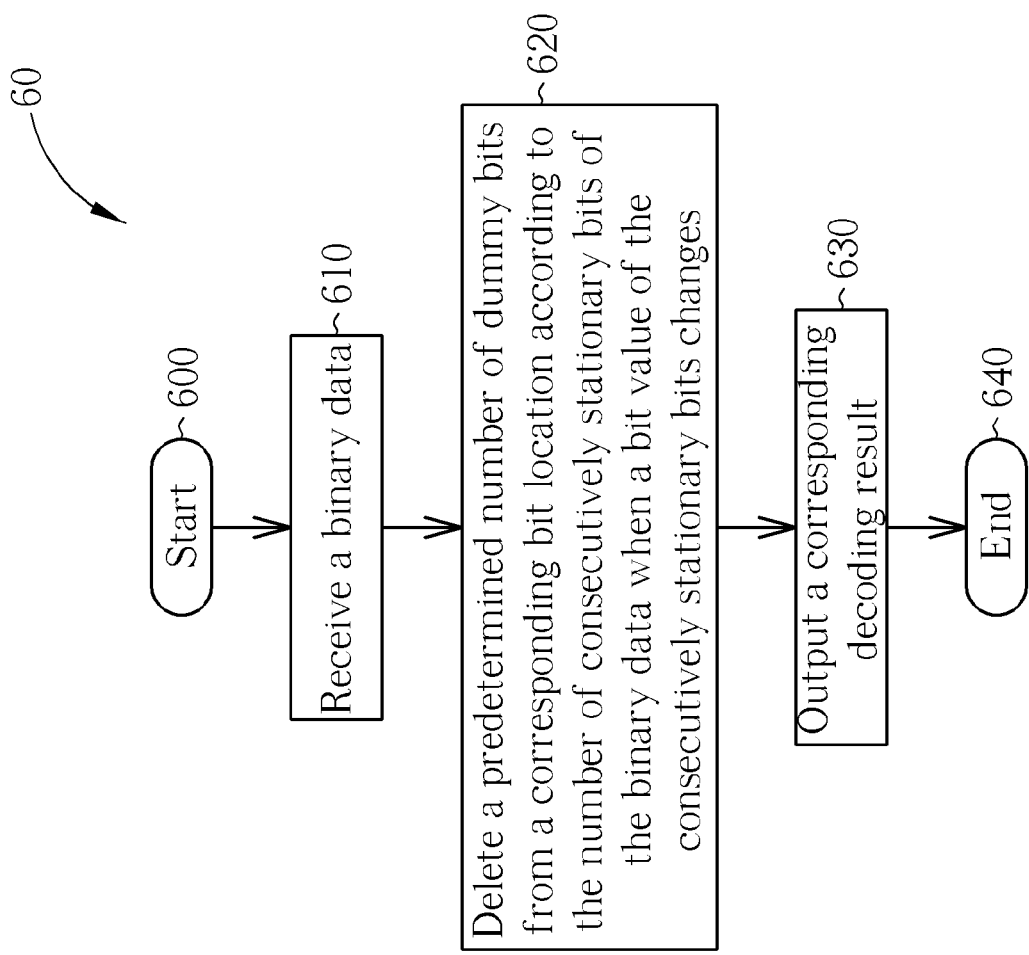
FIG. 18 is a schematic diagram of a decoding process according to bit stationary state resuming decoding of the present invention.

Besides, since the bit stationary state resuming encoding of the present invention stuffs the predetermined number of dummy bits next to the corresponding bits according to the number of consecutively stationary bits, the present invention can also perform corresponding decoding for a received binary data by the same rules. Please refer to FIG. 18. FIG. 18 is a schematic diagram of a decoding process 60 according to bit stationary state resuming decoding of the present invention. The decoding process 60 is corresponding to the encoding process 50, and comprises the following steps:

Step 600: Start.

Step 610: Receive a binary data.

Step 620: Delete a predetermined number of dummy bits from a corresponding bit location according to the number of consecutively stationary bits of the binary data when a bit value of the consecutively stationary bits changes.

Step 630: Output a corresponding decoding result.

Step 640: End.

According to the decoding process 60, the bit stationary state resuming decoding of the present invention deletes a predetermined number of dummy bits from a corresponding bit location according to the number of consecutively stationary bits of the binary data when a bit value of the consecutively stationary bits changes, and then outputs the corresponding decoding results until all bits of the received binary data are decoded completely. In addition, the present invention can stop deleting dummy bits when the number of the deleted dummy bits is greater than an upper limit value. Preferably, a fourth threshold value and a fifth threshold value can be set the same as the encoding process 50. In this case, when a bit value of consecutively stationary bits changes, the present invention can delete a first predetermined number of dummy bits if the number of the consecutively stationary bits exceeds the fourth threshold value but not reaches the fifth threshold value, or otherwise can delete a second predetermined number of dummy bits if the number of the consecutively stationary bits exceeds the fifth threshold value. Thus, if the received binary data is corresponding to the encoding result h[i] mentioned above and the fourth threshold value, the fifth threshold value, the first predetermined number, the second predetermined number and the upper limit value are all set equal to that in the encoding process 50, the binary data h[i] can then be reversed to the original binary data p[i] after being decoded by the decoding process 60.

As mentioned above, when the bit values of the received binary data vary from one bit value stationary state to a temporarily stationary state, the bit stationary state resuming encoding of the present invention can stuff the first or second predetermined number of dummy bits for extending the temporarily stationary state, so as to lower the signal power spectral density with such kinds of data pattern.

Figure 19:
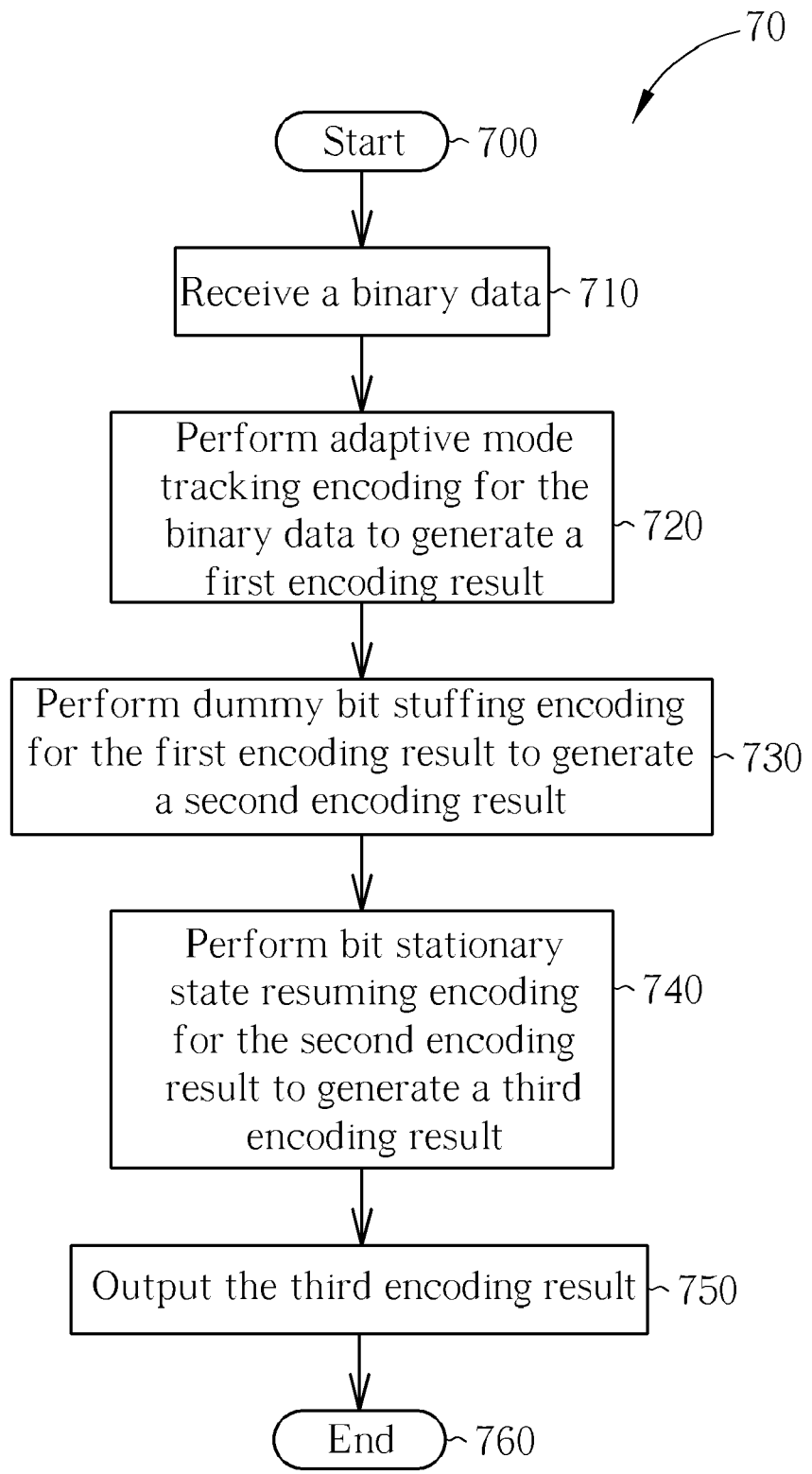
FIG. 19 is a schematic diagram of an encoding process capable of lowering signal power spectral density according to the present invention.

Applications:

In the present invention, the three encoding methods mentioned above can be appropriately combined with each other for obtaining a best data pattern that has the lowest signal power spectral density when transmitted in a binary data transmission system, so as to meet specification requirements of the data transmission system. Please refer to FIG. 19. FIG. 19 is a schematic diagram of an encoding process 70 capable of lowering signal power spectral densities according to the present invention. The encoding process 70 is utilized in a binary data transmission system, and comprises the following steps:

Step 700: Start.
Step 710: Receive a binary data.
Step 720: Perform adaptive mode tracking encoding for the binary data to generate a first encoding result.
Step 730: Perform dummy bit stuffing encoding for the first encoding result to generate a second encoding result.
Step 740: Perform bit stationary state resuming encoding for the second encoding result to generate a third encoding result.
Step 750: Output the third encoding result.
Step 760: End.

According to the encoding process 70, after receiving the binary data, the present invention performs the adaptive mode tracking encoding, the dummy bit stuffing encoding and the bit stationary state resuming encoding in order for the binary data to generate a corresponding encoding result. The adaptive mode tracking encoding, the dummy bit stuffing encoding and the bit stationary state resuming encoding in Step 720~740 are similar to the above-mentioned encoding processes 10, 30 and 50, and are not narrated again herein. By the adaptive mode tracking encoding, the present invention can automatically track and switch to a most suitable encoding mode according to the bit value consecutive variation status of the binary data and generate the first encoding result for reducing the number of bit value consecutive variation times in the binary data. When there still exists the bit value consecutive variation state in the first encoding result, the present invention can then perform the dummy bit stuffing encoding to generate the second encoding result through stuffing the dummy bits into corresponding bit locations for further eliminating the number of bit value consecutive variation times in the first encoding result. Finally, when bit values of the second encoding result vary from one bit value stationary state to another temporarily stationary state, the present invention can further perform the bit stationary state resuming encoding for stuffing a predetermined number of dummy bits according to the number of consecutively stationary bits to obtain a most suitable data pattern for being transmitted in the binary data transmission system. As a result, the signal power spectral density can be lowered to the minimum when transmitting the encoding result in the binary data transmission system, so as to reduce the electromagnetic noises significantly.

Therefore, by the encoding process 70, the present invention can obtain a best transmission data pattern with the lowest signal power spectral densities, so as to meet specification requirements of the binary data transmission system. Additionally, in the present invention, all parameters of the present invention can be adjusted adaptively according to practical demands, and extra signal pins for indicating encoding mode switching are not needed, so that the system expense can be saved significantly.

Figure 20:
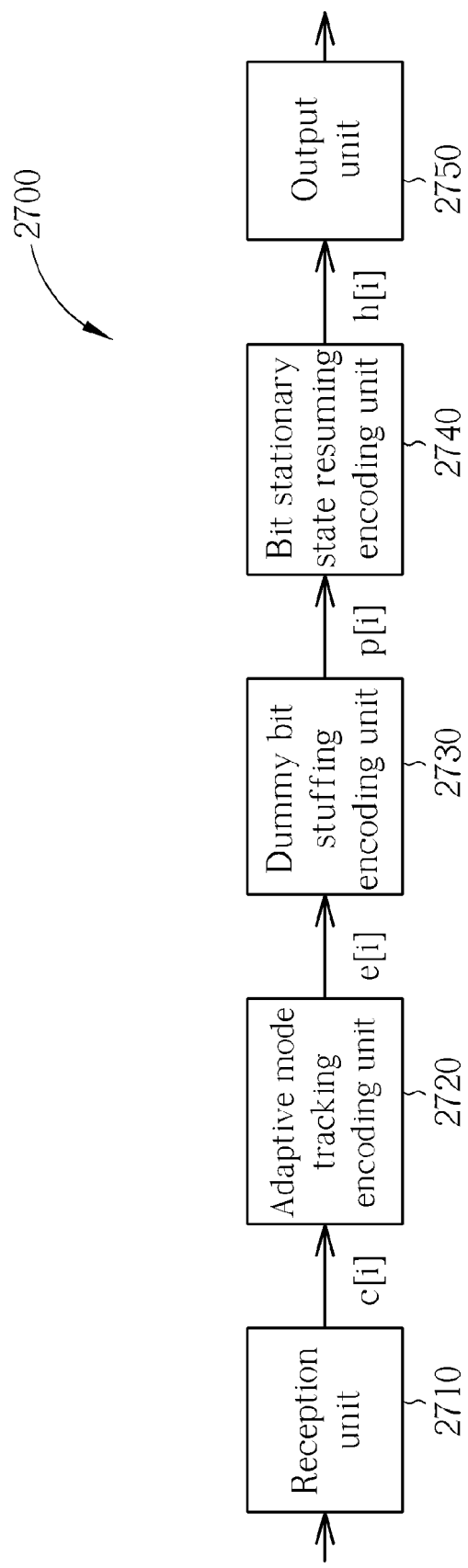
FIG. 20 is a functional block diagram of an encoding device capable of lowering signal power spectral density according to the present invention.

Please refer to FIG. 20. FIG. 20 is a functional block diagram of an encoding device 2700 capable of lowering signal power spectral density according to the present invention. The encoding device 2700 is utilized for realizing the encoding process 70, and can be installed on a transmission terminal of a binary data transmission system. The encoding device 2700 comprises a reception unit 2710, an adaptive mode tracking encoding unit 2720, a dummy bit stuffing encoding unit 2730, a bit stationary state resuming encoding unit 2740 and an output unit 2750. The reception unit 2710 is utilized for receiving a binary data c[i]. The adaptive mode tracking encoding unit 2720 is coupled to the reception unit 2710, and is utilized for performing the adaptive mode tracking encoding for the binary data c[i] to generate a first encoding result e[i]. The dummy bit stuffing encoding unit 2730 is coupled to the adaptive mode tracking encoding unit 2720, and is utilized for performing the dummy bit stuffing encoding for the first encoding result e[i] to generate a second encoding result p[i]. The bit stationary state resuming encoding unit 2740 is coupled to the dummy bit stuffing encoding unit 2730, and is utilized for performing the bit stationary state resuming encoding for the second encoding result p[i] to generate a third encoding result h[i]. The output unit 2750 is coupled to the bit stationary state resuming encoding unit 2740, and is utilized for outputting the third encoding result h[i]. Note that related operations of the adaptive mode tracking encoding unit 2720, the dummy bit stuffing encoding unit 2730 and the bit stationary state resuming encoding unit 2740 are respectively described in the encoding process 10, 30 and 50, and thus are not narrated again herein.

Thus, by the adaptive mode tracking encoding unit 2720, the present invention can automatically track and switch to a most suitable encoding mode according to the bit value consecutive variation status of the binary data c[i] and generate the first encoding result e[i] for reducing the number of bit value consecutive variation times. However, when there still exists the bit value consecutive variation states in the first encoding result e[i], the present invention can stuff the dummy bits to generate the second encoding result p[i] for further eliminating the bit value consecutive variation state in the first encoding result e[i] by the dummy bit stuffing encoding unit 2730. Finally, when bit values of the second encoding result p[i] vary from one bit value stationary state to another temporarily stationary state, the present invention can further stuff a predetermined number of dummy bits according to the number of consecutively stationary bits to generate the third encoding result h[i] with a most suitable data pattern for being transmitted in the binary data transmission system. As a result, the signal power spectral density can be lowered to the minimum when transmitting the encoding result h[i] in the binary data transmission system, so as to reduce the electromagnetic noises significantly. Please note that the encoding device 2700 can be realized by hardware such as simple logic circuits or any firmware, and certainly, those skilled in the art can make appropriate modifications with the same functions, which also belong to the scope of the present invention.

Figure 21:
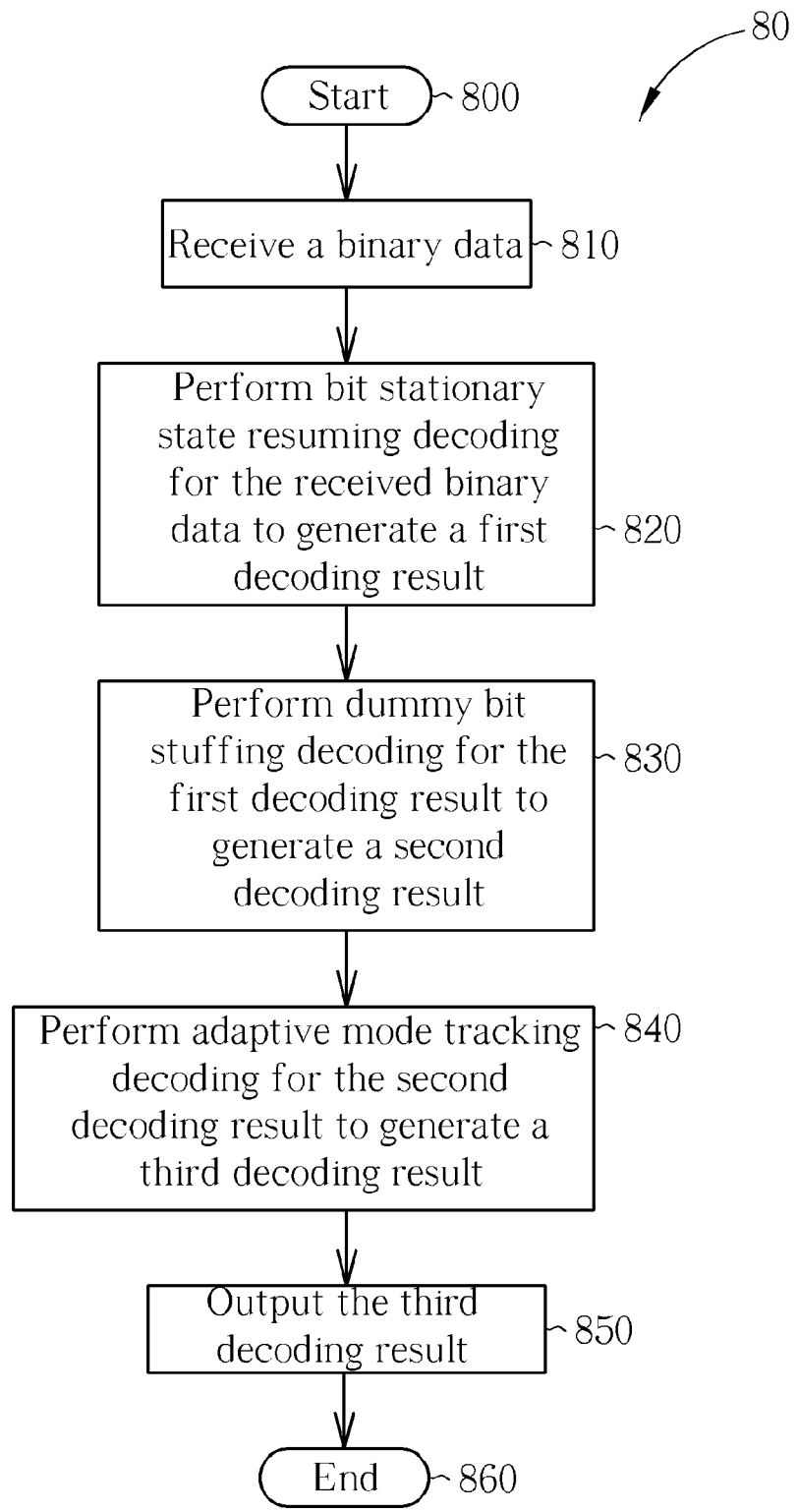
FIG. 21 is a schematic diagram of a decoding process capable of lowering signal power spectral density according to the present invention.

Besides, when a reception terminal of the binary transmission system receives the encoding result generated by the encoding process 70, the present invention can perform corresponding decoding by the same rules. Please refer to FIG. 21. FIG. 21 is a schematic diagram of a decoding process 80 capable of lowering signal power spectral density according to the present invention. The decoding process 80 is correspond to the encoding process 70, and comprises the following steps:

Step 800: Start.
Step 810: Receive a binary data.
Step 820: Perform bit stationary state resuming decoding for the received binary data to generate a first decoding result.
Step 830: Perform dummy bit stuffing decoding for the first decoding result to generate a second decoding result.
Step 840: Perform adaptive mode tracking decoding for the second decoding result to generate a third decoding result.
Step 850: Output the third decoding result.
Step 860: End.

According to the decoding process 80, after receiving the binary data, the present invention performs the bit stationary state resuming decoding, the dummy bit stuffing decoding and the adaptive mode tracking decoding in order for the received binary data, and then outputs a corresponding decoding results. The bit stationary state resuming decoding, the dummy bit stuffing decoding and the adaptive mode tracking decoding in Steps 820~840 are similar to the above-mentioned decoding processes 20, 40 and 60, and thus are not narrated herein again. Preferably, if the received binary data is an encoding result generated by the encoding process 70 and all related parameters in the decoding process 80 are set equal to that in the encoding process, the received binary data can then be reversed to an original binary data after being decoded by the decoding process 80.

Figure 22:
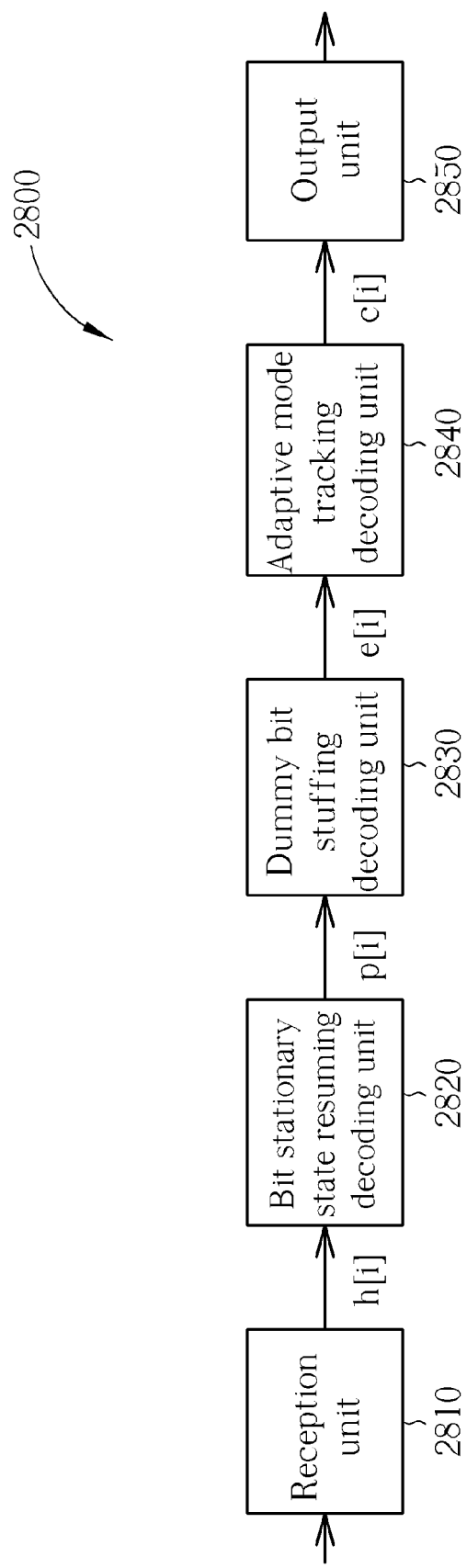
FIG. 22 is a functional block diagram of a decoding device capable of lowering signal power spectral density according to the present invention.

Please refer to FIG. 22. FIG. 22 is a functional block diagram of a decoding device 2800 capable of lowering signal power spectral density according to the present invention. The decoding device 2800 is utilized for realizing the decoding process 80, and can be installed on a reception terminal of a binary data transmission system. The decoding device 2800 comprises a reception unit 2810, a bit stationary state resuming decoding unit 2820, a dummy bit stuffing decoding unit 2830, an adaptive mode tracking decoding unit 2840 and an output unit 2850. The reception unit 2810 is utilized for receiving a binary data h[i] from the binary data transmission system. The bit stationary state resuming decoding unit 2820 is coupled to the reception unit 2810, and is utilized for performing the bit stationary state resuming decoding for the binary data h[i] to generate a first decoding result p[i]. The dummy bit stuffing decoding unit 2830 is coupled to the bit stationary state resuming decoding unit 2820, and is utilized for performing the dummy bit stuffing decoding for the first decoding result p[i] to generate a second decoding result e[i]. The adaptive mode tracking decoding unit 2840 is coupled to the dummy bit stuffing decoding unit 2830, and is utilized for performing the adaptive mode tracking decoding for the second decoding result e[i] to generate a third decoding result c[i]. The output unit 2850 is coupled to the adaptive mode tracking decoding unit 2840, and is utilized for outputting the corresponding result c[i]. Thus, if the received binary data h[i] is the encoding result h[i] outputted from the encoding device 2700 and all related parameters in the decoding device 2800 are set the same as that in the encoding device 2700, the received binary data h[i] can then be reversed to the original binary data c[i] after being decoded by the decoding device 2800.

As mentioned above, the present invention can obtain the most suitable data pattern that have the lowest signal power spectral density for being transmitted, so as to meet the specification requirements of the binary data transmission system. Additionally, in the present invention, all parameters of the present invention can be adjusted adaptively according to practical demands, and extra signal pins for indicating encoding mode switching are not needed, so that the system expense can be saved significantly. Besides, the three encoding/decoding methods of the present invention can be performed independently or can be combined with each other, and are not restricted hereof.

Those skilled in the art will readily observe that numerous modifications and alterations of the device and method may be made while retaining the teachings of the invention.

What is claimed is:

1. An encoding method for a binary data transmission system comprising:
  receiving a binary data;
  utilizing a first encoding mode to encode the binary data;
  switching to utilize a second encoding mode to encode data that has not been encoded in the binary data when the number of bit value consecutive variation times of an encoding result corresponding to the first encoding mode reaches a first threshold value; and
  outputting an encoding result corresponding to the first encoding mode and the second encoding mode.

2. The encoding method of claim 1, wherein utilizing the first encoding mode to encode the binary data comprises:
  outputting a bit, of which a bit value is equal to that of a prior bit of the encoding result, when a bit value of a current bit of the binary data is equal to that of a prior bit of the binary data; and
  outputting the bit, of which a bit value is not equal to that of the prior bit of the encoding result, when the bit value of the current bit of the binary data is not equal to that of the prior bit of the binary data.

3. The encoding method of claim 2, wherein utilizing the first encoding mode to encode the binary data further comprises:
  outputting a first bit, of which a bit value is equal to that of a first bit of the received binary data.

4. The encoding method of claim 1, wherein utilizing the second encoding mode to encode the data that has not been encoded in the binary data comprises:
  outputting a bit, of which a bit value is not equal to that of a prior bit of the encoding result, when a bit value of a current bit of the binary data is equal to that of a prior bit of the binary data; and outputting the bit, of which a bit value is equal to that of the prior bit of the encoding result, when the bit value of the current bit of the binary data is not equal to that of the prior bit of the binary data.

5. The encoding method of claim 1, further comprising:
switching to utilize a third encoding mode to encode data that has not been encoded in the binary data when the number of bit value consecutive variation times of an encoding result corresponding to the second encoding mode reaches a second threshold value.

6. The encoding method of claim 5, wherein the third encoding mode is equal to the first encoding mode.

7. The encoding method of claim 1, further comprising:
stuffing a dummy bit when the number of bit value consecutive variation times of the encoding result corresponding to the first encoding mode and the second encoding mode reaches a third threshold value; and
stopping stuffing dummy bits into the encoding result corresponding to the first encoding mode and the second encoding mode when the number of the stuffed dummy bits reaches an upper limit value.

8. The encoding method of claim 1, further comprising a corresponding decoding step, the decoding step comprises:
receiving the encoding result;
utilizing a first decoding mode corresponding to the first encoding mode to decode the encoding result;
switching to utilize a second decoding mode corresponding to the second encoding mode to decode data that has not been decoded in the encoding result when the number of bit value consecutive variation times of the received encoding result reaches the first threshold value; and
outputting a corresponding decoding result.

9. An encoding method capable of lowering signal power spectral density for a binary data transmission system comprising:
receiving a binary data;
performing adaptive mode tracking encoding for the binary data to generate a first encoding result;
performing dummy bit stuffing encoding for the first encoding result to generate a second encoding result;
performing bit stationary state resuming encoding for the second encoding result to generate a third encoding result; and
outputting the third encoding result.

10. The encoding method of claim 9, wherein performing the adaptive mode tracking encoding for the binary data comprises:
receiving the binary data;
utilizing a first encoding mode to encode the binary data;
switching to utilize a second encoding mode to encode data that has not been encoded in the binary data when the number of bit value consecutive variation times of an encoding result corresponding to the first encoding mode reaches a first threshold value; and
outputting an encoding result corresponding to the first encoding mode and the second encoding mode.

11. The encoding method of claim 10, wherein utilizing the first encoding mode to encode the binary data comprises:
outputting a bit, of which a bit value is equal to that of a prior bit of the encoding result, when a bit value of a current bit of the binary data is equal to that of a prior bit of the binary data; and
outputting the bit, of which a bit value is not equal to that of the prior bit of the encoding result, when the bit value of the current bit of the binary data is not equal to that of the prior bit of the binary data.

12. The encoding method of claim 11, wherein utilizing the first encoding mode to encode the binary data further comprises:
outputting a first bit, of which a bit value is equal to that of a first bit of the received binary data.

13. The encoding method of claim 10, wherein utilizing the second encoding mode to encode the data that has not been encoded in the binary data comprises:
outputting a bit, of which a bit value is not equal to that of a prior bit of the encoding result, when a bit value of a current bit of the binary data is equal to that of a prior bit of the binary data; and
outputting the bit, of which a bit value is equal to that of the prior bit of the encoding result, when the bit value of the current bit of the binary data is not equal to that of the prior bit of the binary data.

14. The encoding method of claim 10, further comprising:
switching to utilize a third encoding mode to encode data that has not been encoded in the binary data when the number of bit value consecutive variation times of an encoding result corresponding to the second encoding mode reaches a second threshold value.

15. The encoding method of claim 14, wherein the third encoding mode is equal to the first encoding mode.

16. The encoding method of claim 9, wherein performing the dummy bit stuffing encoding for the first encoding result comprises:
receiving the first encoding result;
stuffing a dummy bit next to a corresponding bit when the number of bit value consecutive variation times of the first encoding result reaches a third threshold value; and
outputting the second encoding result.

17. The encoding method of claim 16, further comprising:
stopping stuffing dummy bits into the first encoding result when the number of the stuffed dummy bits reaches an upper limit value.

18. The encoding method of claim 9, wherein performing the bit stationary state resuming encoding for the second encoding result comprising:
receiving the second encoding result;
stuffing a predetermined number of dummy bits next to a corresponding bit for generating the third encoding result according to the number of consecutively stationary bits of the binary data when a bit value of the consecutively stationary bits changes; and
outputting the third encoding result.

19. The encoding method of claim 18, further comprising:
stopping stuffing dummy bits when the number of the stuffed dummy bits is greater than a predetermined value.

20. The encoding method of claim 18, wherein a bit value of the predetermined number of dummy bits is equal to that of the corresponding bit.

21. The encoding method of claim 9, further comprising a decoding step, the decoding step comprises:
receiving the third encoding result;
performing bit stationary state resuming decoding for the third encoding result to generate a first decoding result;
performing dummy bit stuffing decoding for the first decoding result to generate a second decoding result;
performing adaptive mode tracking decoding for the second decoding result to generate a third decoding result; and
outputting the third decoding result.

* * * * *